(12) United States Patent
Higuchi et al.

(10) Patent No.: US 7,011,706 B2
(45) Date of Patent: Mar. 14, 2006

(54) DEVICE SUBSTRATE AND METHOD FOR PRODUCING DEVICE SUBSTRATE

(75) Inventors: Takamitsu Higuchi, Matsumoto (JP); Setsuya Iwashita, Nirasaki (JP); Hiromu Miyazawa, Toyoshina-machi (JP)

(73) Assignee: Seiko Epson Corporation, (JP)

( * ) Notice: Subject to any disclaimer, the term of this patent is extended or adjusted under 35 U.S.C. 154(b) by 182 days.

(21) Appl. No.: 10/401,288

(22) Filed: Mar. 27, 2003

(65) Prior Publication Data

US 2004/0011280 A1    Jan. 22, 2004

(30) Foreign Application Priority Data

Mar. 27, 2002 (JP) ............................. 2002-089820

(51) Int. Cl.
*C30B 25/02* (2006.01)

(52) U.S. Cl. ............................. 117/89; 117/90; 117/93; 117/94; 117/95; 117/104

(58) Field of Classification Search ............... 117/89, 117/90, 93, 94, 95, 104
See application file for complete search history.

(56) References Cited

U.S. PATENT DOCUMENTS

| | | | |
|---|---|---|---|
| 6,045,626 A * | 4/2000 | Yano et al. | 148/33.4 |
| 6,258,459 B1 * | 7/2001 | Noguchi et al. | 428/446 |
| 6,749,686 B1 * | 6/2004 | Ami et al. | 117/84 |

FOREIGN PATENT DOCUMENTS

| | | |
|---|---|---|
| JP | 11-162852 | 6/1999 |
| JP | 2001-284349 | 10/2001 |

* cited by examiner

*Primary Examiner*—Robert Kunemund
(74) *Attorney, Agent, or Firm*—Harness, Dickey & Pierce, P.L.C.

(57) ABSTRACT

A device substrate is provided having: a Si(111) substrate; a buffer layer formed by epitaxial growth on the Si(111) substrate 11, and containing at least one of a rare earth metal oxide and an alkali earth metal oxide; and a semiconductor material layer formed by epitaxial growth on the buffer layer, and containing at least one of a group II–VI semiconductor material having a wurtzite structure and a group III–V semiconductor material having a wurtzite structure. The buffer layer preferably comprises a hexagonal crystal structure oriented in the (001) plane or a cubic crystal structure oriented in the (111) plane, and the semiconductor material layer preferably comprises a hexagonal crystal structure oriented in the (001) plane.

29 Claims, 3 Drawing Sheets

| COMPOSITION FORMULA | LATTICE CONSTANT (nm) | | CRYSTAL STRUCTURE |
|---|---|---|---|
| | a | c | |
| AlN | 0.3112 | 0.4980 | WURTZITE TYPE |
| GaN | 0.3192 | 0.5196 | WURTZITE TYPE |
| InN | 0.3545 | 0.5703 | WURTZITE TYPE |
| ZnO | 0.3253 | 0.5213 | WURTZITE TYPE |
| ZnS | 0.3823 | 0.6261 | WURTZITE TYPE |
| ZnSe | 0.4003 | 0.6540 | WURTZITE TYPE |
| CdS | 0.4137 | 0.6716 | WURTZITE TYPE |
| CdSe | 0.4274 | 0.6991 | WURTZITE TYPE |
| $La_2O_3$ | 0.3973 | 0.6130 | |
| $Ce_2O_3$ | 0.3891 | 0.6063 | |
| $Pr_2O_3$ | 0.3859 | 0.6013 | |
| $Nd_2O_3$ | 0.3830 | 0.5999 | |
| $Pm_2O_3$ | 0.3802 | 0.5954 | |
| $Sm_2O_3$ | 0.3860 | 0.6170 | |
| $Eu_2O_3$ | 0.3840 | 0.6140 | |
| $Gd_2O_3$ | 0.3860 | 0.6160 | |
| $Tb_2O_3$ | 0.3830 | 0.6120 | |
| $Dy_2O_3$ | 0.3820 | 0.6110 | |
| $Ho_2O_3$ | 0.3800 | 0.6080 | |
| $Er_2O_3$ | 0.3780 | 0.6050 | |
| $Tm_2O_3$ | 0.3760 | 0.6020 | |
| Mg–Mg OF MgO | 0.2978 | | |
| Ca–Ca OF CaO | 0.3391 | | |
| Sr–Sr OF SrO | 0.3670 | | |
| Ba–Ba OF BaO | 0.3886 | | |
| Si–Si OF Si(111) | 0.3840 | | |

DEVICE SUBSTRATE AND METHOD FOR PRODUCING DEVICE SUBSTRATE

BACKGROUND OF THE INVENTION

1. Technical Field of the Invention

The present invention relates to a device substrate and a method for producing the device substrate.

2. Description of the Related Art

Group III–V semiconductor materials such as GaN and group II–VI semiconductor materials such as ZnO have been developed as materials for constructing luminous elements such as a laser diode, since these materials are direct transition semiconductor materials having an energy gap of 2 to 6 eV.

Since a good quality and large single crystal substrate constituting these materials currently cannot be obtained for forming (depositing) a thin layer of these semiconductor materials today, these materials are inevitably deposited by hetero-epitaxial growth on a substrate having a different lattice constant and thermal expansion coefficient.

For example, there has been the following problems for forming AlN crystals or a GaN crystals on a Si(111) substrate by hetero-epitaxial growth.

While the Si—Si distance of the Si(111) face is 0.384 nm, the lattice constants of GaN are a=0.3192 nm and c=0.5196 nm, and the lattice constants of AlN are a=0.3112 and c=0.4980. Therefore, the lattice mismatch of these crystals with the Si(111) face is as large as 50% or more.

Consequently, when these semiconductor materials are grown on the Si(111) substrate by hetero-epitaxial growth, the crystals of these materials suffer from lattice distortion causing a decrease in quality. The characteristics of a luminous element formed using these semiconductor materials are also inevitably deteriorated.

In view of the foregoing, one object of the present invention is to provide a device substrate comprising high quality semiconductor material layers, and a method for producing such device substrate.

SUMMARY

The above object of the present invention can be attained by the following means (1) to (23):

(1) A device substrate comprising:
a Si(111) substrate;
a buffer layer formed by epitaxial growth on the Si(111) substrate, and containing at least one of a rare earth metal oxide and an alkali earth metal oxide; and
a semiconductor material layer formed by epitaxial growth on the buffer layer, and containing at least one of a group II–VI semiconductor material having a wurtzite structure and a group III–V semiconductor material having a wurtzite structure;

(2) The device substrate according to (1), wherein the rare earth metal is at least one of La, Ce, Pr, Nd, Pm, Sm, Eu, Gd, Tb, Dy, Ho, Er, Tm, Yb, Lu and Y;

(3) The device substrate according to (1) or (2), wherein the alkali earth metal is at least one of Mg, Ca, Sr and Ba;

(4) The device substrate according to any one of (1) to (3), wherein the buffer layer comprises a hexagonal crystal structure oriented in the (001) plane or a cubic crystal structure oriented in the (111) plane;

(5) The device substrate according to any one of (1) to (4), wherein the buffer layer has a mean thickness of 10 nm or less;

(6) The device substrate according to any one of (1) to (5), wherein the group II–VI semiconductor material having the wurtzite structure is at least one of a Zn compound, Cd compound, and a solid solution containing these compounds;

(7) The device substrate according to (6), wherein the Zn compound is ZnO, ZnS or ZnSe;

(8) The device substrate according to (6) or (7), wherein the Cd compound is CdS or CdSe;

(9) The device substrate according to any one of (1) to (8), wherein the group III–V semiconductor material having the wurtzite structure is GaN, a compound in which a part of Ga in GaN is substituted with at least one of the group III elements, a compound in which a part of N in GaN is substituted with at least one of the group V elements, or at least one of the solid solution containing these elements;

(10) The device substrate according to any one of (1) to (9), wherein the semiconductor material layer has a hexagonal crystal structure oriented in the (001) plane;

(11) A method for producing a device substrate comprising the steps of;
cleaning a Si(111) substrate;
forming a buffer layer containing at least one of a rare earth metal oxide and an alkali earth metal oxide by epitaxially growth by irradiating a plasma containing an oxygen plasma and at least one of a rare earth metal plasma and an, alkali earth metal plasma on the Si(111) substrate under a reduced pressure; and
forming a semiconductor material layer containing at least one of a group II–VI semiconductor material having a wurtzite structure and a group III–V semiconductor material having a wurtzite structure by epitaxial growth by irradiating at least one of a plasma containing a group II element plasma and a group VI element plasma, and a plasma containing a group III element plasma and a group V element plasma on the buffer layer under a reduced pressure;

(12) The method for producing the device substrate according to (11), wherein a spontaneous oxidation layer is not eliminated from the Si(111) substrate;

(13) The method for producing the device substrate according to (11) or (12), wherein a treatment for obtaining a reconstitution surface or a hydrogen-terminated surface is not applied in the step for cleaning the Si(111) substrate;

(14) The method for producing the device substrate according to (12) or (13), wherein the buffer layer is allowed to epitaxially grow while eliminating the spontaneous oxidation layer by selectively irradiating the rare earth metal plasma and/or the alkali earth metal plasma rather than the oxygen plasma on the Si(111) substrate in the step for forming the buffer layer;

(15) The method for producing the device substrate according to any one of (11) to (14), wherein the rare earth metal is at least one of La, Ce, Pr, Nd, Pm, Sm, Eu, Gd, Tb, Dy, Ho, Er, Tm, Yb, Lu and Y;

(16) The method for producing the device substrate according to any one of (11) to (15), wherein the buffer layer is allowed to epitaxially grow as a hexagonal crystal oriented in a (001) plane or as a cubic crystal oriented in a (111) face;

(17) The method for producing the device substrate according to any one of (11) to (16), wherein the buffer layer has a thickness of 10 nm or less;

(18) The method for producing the device substrate according to any one of (11) to (17), wherein the group II–VI semiconductor material having the wurtzite structure is at least one of a Zn compound, Cd compound, and a solid solution containing these compounds;

(19) The method for producing the device substrate according to (18), wherein the Zn compound is ZnO, ZnS or ZnSe;

(20) The method for producing the device substrate according to (18) or (19), wherein the Cd compound is CdS or CdSe;

(21) The method for producing the device substrate according to any one of (11) to (20), wherein the group III–V semiconductor material having the wurtzite structure is GaN, a compound in which a part of Ga in GaN is substituted with at least one of the group III elements, a compound in which a part of N in GaN is substituted with at least one of the group V elements, or at least one of the solid solution containing these elements;

(22) The method for producing the device substrate according to any one of (11) to (21), wherein the semiconductor material layer is allowed to epitaxially grow as a hexagonal crystal oriented in a (001) plane; and

(23) The method for producing the device substrate according to any one of (11) to (22), wherein the plasma is generated using a laser beam.

BRIEF DESCRIPTION OF THE DRAWINGS

FIG. 3 shows a table indicating the lattice constant and inter-atomic distance of the crystal of each compound.

DETAILED DESCRIPTION

Preferable embodiments of the device substrate and the method for producing the device substrate according to the present invention will be described hereinafter.

Figure 1:
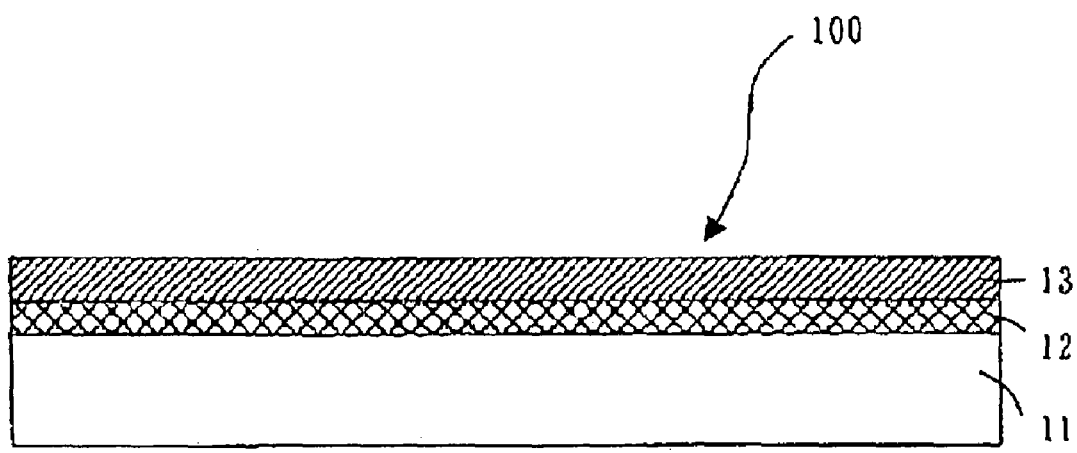
FIG. 1 is a vertical cross section of one embodiment of a device substrate according to the present invention.

FIG. 1 is a vertical cross section showing the embodiment of the device substrate according to the present invention. FIGS. 2(a)–2(c) are vertical cross sections for illustrating the method for producing the device substrate according to the present invention. FIG. 3 shows a table indicating lattice constants and inter-atomic distance of the crystals of various compounds.

The device substrate 100 shown in FIG. 1 comprises a Si(111) substrate 11, a buffer layer 12 formed on the Si(111) substrate 11, and a semiconductor material layer 13 formed on the buffer layer 12.

The Si(111) substrate 11 is provided for supporting the buffer layer 12 and semiconductor material layer 13 to be described hereinafter, or serves as a substrate of a device 100, and is preferably constituted with a flat member.

A Si(111) substrate was employed as the base material of the device substrate 100 for the following reasons.

Firstly, since the Si substrate is a general use substrate, the production cost of the device substrate 100 may be reduced by employing the Si substrate.

While examples of the Si substrate include a Si(100) substrate and Si(110) substrate other than the Si(111) substrate 11, the Si—Si distance of the Si(111) substrate 11 is closer to the lattice constant (the length of the a-axis) of the crystal of the semiconductor materials to be used for constructing the semiconductor material layer 13 (see FIG. 3).

The Si substrate, particularly the Si(111) substrate 11, was selected as the base material of the device substrate 100 for at least the reasons described above.

The Si(111) substrate 11 is simply named as "Si substrate 11" hereinafter.

While the mean thickness of the Si substrate 11 is not particularly restricted, it is preferably 10 to 1000 μm, more preferably 100 to 600 μm. The device substrate 100 may be advantageously thinned (reduced) while maintaining a sufficient strength by adjusting the mean thickness of the Si substrate 11 within the range above.

A thin layer of the buffer layer 12 is provided (formed) on the Si substrate 11.

While the Si substrate 11 has a Si—Si distance closer to the lattice constant (the length of a-axis) of the crystal of the semiconductor materials to be used for the semiconductor layer to be described hereinafter as compared with other Si substrates, epitaxial growth is often impossible or sufficient adhesion (joint) cannot be attained due to lattice mismatch when the semiconductor material 13 is directly grown on the Si substrate 11.

Accordingly, the inventors of the present invention have discovered that one effective way for solving the problems described above is to provide a certain buffer layer between the Si substrate 11 and semiconductor material layer 13, particularly to use a compound having crystal lattice constants relatively close to both the Si—Si distance of the Si substrate 11 and the lattice constant of the crystal of the semiconductor material as the material constituting the buffer layer, or a compound that can facilitate epitaxial growth on the Si substrate 11. The inventors of the present invention found that, through intensive studies, oxides of rare earth metals or alkali earth metals are suitable as these compounds.

Accordingly, the buffer layer 12 contains at least one of the rare earth metal oxides and the alkali earth metal oxides (preferably as major materials) in order to prevent the drawbacks described above from occurring.

Such a buffer layer 12 permits the semiconductor material layer 13 to be described hereinafter to be readily and reliably formed by epitaxial growth to enable a high quality layer to be obtained.

The rare earth metals are not particularly restricted, and they are preferably at least one of La, Ce, Pr, Nd, Pm, Sm, Eu, Gd, Tb, Dy, Ho, Er, Tm, Yb, Lu and Y. The oxides of such rare earth metals have small mismatch with both the Si—Si distance of the Si(111) crystal and lattice constant of the semiconductor material to be used for the semiconductor material layer 13 to be described hereinafter. Since such oxides are readily epitaxially grown on the Si substrate 11, matching between the Si substrate 11 and the semiconductor material layer 13 is improved while enhancing the quality of the semiconductor material layer 13 to be described hereinafter.

While the alkali earth metals are also not particularly restricted and various elements may be used, they are preferably at least one of Mg, Ca, Sr and Ba. Oxides of such alkali earth metals have small mismatch with both the Si—Si distance of the (111) face of the Si crystal and the lattice constant of the crystal of the semiconductor material to be used for the semiconductor material layer 13 to be described hereinafter, and are readily epitaxially grown on the Si substrate 11. Consequently, matching between the Si substrate 11 and semiconductor material layer 13 can be improved while enhancing the quality of the semiconductor material layer 13.

While examples of the buffer layer 12 include hexagonal crystals oriented in the (001) plane, cubic crystals oriented in the (111) plane, and rhombohedral crystals oriented in the (111) plane, the hexagonal crystals oriented in the (001)

plane and cubic crystals oriented in the (111) plane are preferable among them. The mean thickness of the buffer layer 12 may become relatively small by forming the buffer layer 12 with the hexagonal crystals oriented in the (001) plane and cubic crystals oriented in the (111) plane. Accordingly, the device substrate 100 becomes chemically stable even by forming the buffer layer 12 with chemically unstable oxides of the rare earth metals and alkali earth metals.

The buffer layer 12 is preferably formed as thin as possible from the view point described above, and the mean thickness is preferably 10 nm or less, more preferably 5 nm or less, in order to conspicuously exhibit the effect described above.

The proportion of these compounds in the buffer layer 12 may be continuously or discontinuously changed in the thickness direction when the buffer layer 12 comprises a combination of at least two of these compounds.

The semiconductor material layer 13 is provided (formed) on the buffer layer 12.

The semiconductor material layer 13 is formed on the buffer layer 12 by epitaxial growth, and the layer contains at least one of a group II–VI semiconductor material having a wurtzite structure and a group III–V semiconductor material having a wurtzite structure (preferably comprising a major material).

The semiconductor materials having the wurtzite structure, particularly both the group II–VI semiconductor material having the wurtzite structure and the group III–V semiconductor material having the wurtzite structure, are direct transition semiconductor materials with a energy gap (band gap) of 2 to 6 eV. Accordingly, semiconductors having excellent light emitting characteristics (device characteristics) may be obtained by constituting a luminous element (device) such as a laser diode using such a device substrate 100.

While the group II–VI semiconductor material having the wurtzite structure is not particularly restricted, and various materials may be used, they are preferably at least one of a Zn compound and a Cd compound, or a solid solution containing these compounds. The device substrate 100 may become more useful for constructing various devices by using the group II–VI semiconductor materials having the wurtzite structure. In addition, the characteristics of the device obtained may be arbitrarily determined by properly selecting the kinds of the semiconductor materials.

ZnO, ZnS or ZnSe is suitable as the Zn compound, and CdS or CdSe is suitable as the Cd compound. The effect as described above may be more evidently exhibited by using these compounds.

The group III–V semiconductor material having the wurtzite structure is not particularly restricted, and various compounds may be used. The preferable examples thereof include GaN or compounds in which a part of Ga in GaN is substituted with at least one of the group III elements, compounds in which a part of N is substituted with at least one of the group V elements, or at least one solid solution containing these elements. The device substrate 100 may be more useful for constructing various devices such as luminous elements as described above by using the group III–V semiconductor materials having the wurtzite structure, and the characteristics of various devices obtained may be readily determined by properly selecting the kinds of the semiconductor materials.

B, Al and In are favorable as the group III element, while P, As and Sb are suitable as the group V element. The effect as described above may be evidently exhibited by using these compounds.

While the semiconductor material layer 13 may be any one of the hexagonal crystal oriented in the (001) plane or the cubic crystal oriented in the (111) plane, the hexagonal crystal oriented in the (001) plane is preferable. Forming the semiconductor material with such a crystal permits mismatch with the buffer layer 12 to be reduced, crystallinity of the semiconductor material layer 13 to be improved, and light emitting characteristics to be improved.

While the mean thickness of the semiconductor material layer 13 is not particularly restricted, it is preferably 10 to 1000 nm, more preferably 100 to 500 nm.

When the semiconductor material layer 13 is formed with a combination of at least two compounds of the compounds described above, the ratio thereof may be continuously or discontinuously changed in the thickness direction.

Figure 2:
FIGS. 2(a)–2(c) are a vertical cross sections illustrating the method for manufacturing the device substrate according to the present invention.
Figure 2:
Figure 2:
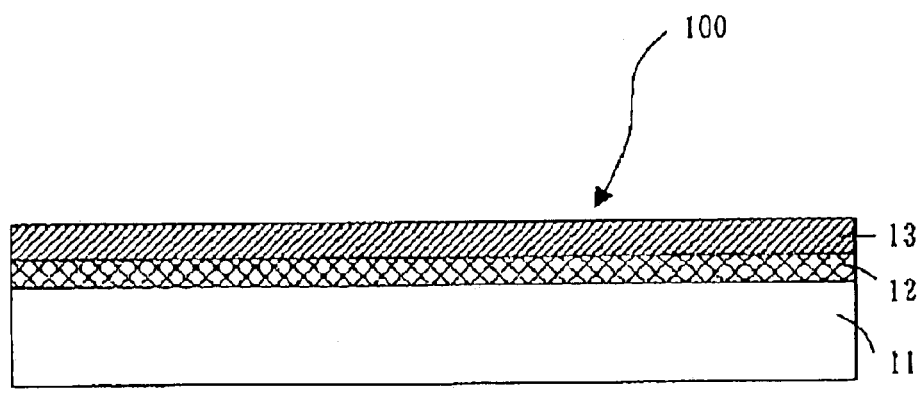

The method for producing the device substrate 100 according to the present invention will be described with reference to FIG. 2.

The device substrate 100 is manufactured as follows.

The method for producing the device substrate 100 comprises the steps of: cleaning the Si substrate 11 (Si substrate cleaning step); forming the buffer layer 12 on the Si substrate 11 (buffer layer forming step); and forming the semiconductor material layer 13 on the buffer layer 12 (semiconductor material layer forming step). Each step will be sequentially described below.

The Si substrate 11 is prepared first. A substrate having a uniform thickness and, preferably, with no bent portions and flaws is used for the Si substrate 11.

(1) Si Substrate Cleaning Step

The Si substrate 11 is first cleaned by removing adsorbed substances on the surface of the Si substrate 11 (for example, degreasing).

The adhered substances are removed by allowing the Si substrate 11 to contact a removing liquid.

While the methods for allowing the Si substrate 11 to contact the removing liquid are not particularly restricted, they include dipping the surface of the Si substrate 11 into the removing liquid (dipping method), spraying (showering) the removing liquid onto the surface of the Si substrate 11, and applying the removing liquid on the surface of the Si substrate 11 (coating method).

The dipping method is preferably used as the contact method among these methods. The dipping method permits the adhered substances (for example organic substances) to be readily and reliably removed from the surface of the Si substrate 11. The dipping method is also advantageous in that plural (a large number of) Si substrates 11 can be simultaneously treated.

The substrate may be dipped while applying ultrasonic vibration to the removing liquid, or at least one of the Si substrate 11 and removing liquid may be rocked.

Examples of the removing liquid include various organic solvents including alcohols such as methyl alcohol, ethyl alcohol, propyl alcohol and butyl alcohol; ketones such as acetone, methylethyl ketone and methylisobutyl ketone; esters such as ethyl acetate and methyl acetate; ethers such as diethyl ether, diisopropyl ether, tetrahydrofuran and dioxane; nitrites such as acetonitrile and propionitrile; halogenated hydrocarbons such as methylene chloride, chloroform, 1,2-dichloroethane and 2,2-tetrachloroethane; and hydrocarbons such as n-hexane, petroleum ether, toluene, benzene and xylene. One or a combination of at least two of them may be used.

While the spontaneous oxidation layer on the surface of the Si substrate 11 may be either removed or not removed for subjecting the substrate to the next step (2), it is preferable to use the substrate from which the spontaneous oxidation layer is not removed. In other words, the Si substrate 11 from which the spontaneous oxidation layer is not removed may be used in the method for manufacturing the device substrate according to the present invention. Consequently, the work for removing the spontaneous oxidation layer may be omitted.

The process for removing the spontaneous oxidation layer includes a treatment for forming a reconstruction surface or a treatment for forming a hydrogen-terminated surface on the surface of the Si substrate 11. However, omitting (eliminating) these treatments is advantageous in step (1), since the method for producing the device substrate 100 may be simplified or the production time and cost may be reduced.

Accordingly, the spontaneous oxidation layer 14 remains on the surface of the Si substrate 11 (see FIG. 2a)).

(2) Buffer Layer Forming Step

The buffer layer 12 is formed on the Si substrate 11 by the following method.

The Si substrate 11 is first fitted in a substrate holder.

Then, the Si substrate 11 fitted in the holder is placed in a vacuum chamber evacuated to a back pressure of about $133 \times 10^{-9}$ to $133 \times 10^{-6}$ Pa ($1 \times 10^{-9}$ to $1 \times 10^{-6}$ Torr).

A first target (buffer layer target) including the elements constituting the buffer layer 12 is disposed in an opposed relation to the Si substrate 11 with a given distance therebetween. The favorably used target comprises the same or similar composition as the composition of the desired buffer layer 12.

Subsequently, the temperature of the Si substrate 11 is increased by heating with an IR lamp (a heating device).

While the heating speed is not particularly restricted, it is preferably 1 to 20° C./minute, more preferably 5 to 15° C./minute.

While the final temperature of the Si substrate 11 is not particularly restricted, it is preferably 500 to 900° C., more preferably 600 to 800° C.

The pressure in the vacuum chamber initially increases due to evaporation of a part of the spontaneous oxidation film 14 as SiO as the temperature of the Si substrate 11 increases. However, the pressure in the vacuum chamber settles to be constant when the temperature of the Si substrate 11 has reached a prescribed temperature.

Conditions such as the heating speed, the temperature of the Si substrate 11 and the pressure in the vacuum chamber are not restricted to the ranges as described above, so long as a heat oxidation layer is not additionally formed.

Once the pressure in the vacuum chamber is stabilized at a constant pressure (for example $133 \times 10^{-8}$ to $133 \times 10^{-6}$ Pa ($1 \times 10^{-8}$ to $1 \times 10^{-6}$ Torr)), or under the reduced pressure, the oxygen plasma and a plasma containing at least one of the rare earth metal plasma and the alkali earth metal plasma are irradiated onto the Si substrate 11. As a result, the buffer layer containing at least one of the rare earth metal oxide and the alkali earth metal oxide is epitaxially grown on the Si substrate 11 to form (deposit) a layer (thin layer).

The plasma may be generated by impinging the surface of the first target with a laser beam, an argon gas (inert gas) plasma or an electron beam.

It is particularly preferable to generate the plasma using the laser beam. The plasma may be readily and reliably generated to form the buffer layer 12 by the method using the laser beam, by providing a vacuum chamber having a simple construction such as a laser incidence window.

The laser beam is preferably a pulse plasma beam having a wavelength of about 150 to 300 nm and a pulse duration of about 1 to 100 ns. Examples of sources of such laser beams include an eximer laser such as an ArF eximer laser, a KrF eximer laser, A XeCl eximer laser, and a YAG laser, $YVO_4$ laser and $Co_2$ laser. The ArF eximer laser and KrF eximer laser are preferred among them, since the ArF eximer laser and KrF eximer laser are easy to handle while enabling the plasma to be readily and reliably generated.

Among these plasmas (plasma plume), it is preferable to selectively irradiate at least one of the rare earth metal plasma and the alkali earth metal plasma, rather than the oxygen plasma, onto the Si substrate 11. This is because the rare earth metal plasma and the alkali earth metal plasma that are likely to be preferentially bonded with oxygen over Si replace Si in the spontaneous oxidation layer 14, thereby enabling the oxides of the rare earth metals and alkali earth metals to be readily obtained. In other words, the buffer layer 12 may be epitaxially grown while removing the spontaneous oxidation layer 14 on the surface of the Si substrate 11.

The conditions for forming the buffer layer 12 may be determined as follows from the view point as described above.

The frequency of the laser beam is preferably 3 Hz or less, more preferably 1.5 Hz or less.

The energy density of the laser beam is preferably 0.5 $J/cm^2$ or more, more preferably 2 $J/cm^2$ or more.

The temperature of the Si substrate 11 is preferably 550 to 850° C., more preferably 650 to 750° C.

The distance between the Si substrate 11 and the first target is preferably 50 mm or less, more preferably 35 mm or less.

The pressure in the vacuum chamber is preferably $133 \times 10^{-4}$ Pa ($1 \times 10^{-4}$ Torr) or less, more preferably $133 \times 10^{-6}$ Pa ($1 \times 10^{-6}$ Torr) or less.

At least one of the rare earth metal plasma and the alkali earth metal plasma, rather than the oxygen plasma, can be selectively irradiate onto the Si substrate 11 by setting the conditions for forming the buffer layer 12 within the ranges described above. Consequently, the buffer layer 12 can be reliably formed while removing the spontaneous oxidation layer 14.

Properly setting the laser beam irradiation time (the irradiation time of the plasma onto the Si substrate 11) permits the mean thickness of the buffer layer 12 within the range described above. While the laser irradiation time differs depending on the above conditions, it is preferably 200 seconds or less, more preferably 100 seconds or less.

The buffer layer 12 is obtained as described above (see FIG. 2(b)).

(3) Semiconductor Material Layer Forming Step

The semiconductor material layer 13 is formed on the buffer layer 12 by the following method.

A second target (semiconductor material layer forming target) is substituted in place of the first target and is disposed at a given distance away from and opposed to the buffer layer 12 (Si substrate 11) prior to forming the semiconductor layer 13. A substance having a composition which is the same as or similar to the composition of the desired semiconductor material layer 13 is preferably used as the target.

At least one of a plasma containing the group II element plasma and a plasma containing the group VI element plasma, and a plasma containing the group III element plasma and a plasma containing the group V element plasma is irradiated onto the buffer layer 12 in vacuum after step (2). Consequently, the semiconductor material layer 13 containing the semiconductor material (the same material as described above) having a wurtzite structure is epitaxially. grown (deposited) as a layer (a thin layer or thick layer).

The plasma is preferably generated by irradiating (impinging) the laser beam onto the surface of the second target as in step (2).

The laser beam source is preferably the ArF eximer laser or KrF eximer laser as in step (2).

In the conditions for forming the semiconductor material layer 13, the plasma of each element (plasma plume) may arrive on the buffer layer 12 with a given ratio (the composition ratio in the semiconductor material having the wurtzite structure), and the semiconductor material 13 layer may be epitaxially grown. The conditions are as follows.

The frequency of the laser beam is preferably 30 Hz or less, more preferably 15 Hz or less.

The energy density of the laser beam is preferably 0.5 $J/cm^2$ or more, more preferably 2 $J/cm^2$ or more.

The temperature of the Si substrate 11 on which the buffer layer 12 is formed is preferably 500 to 900° C., more preferably 600 to 800° C.

The distance between the Si substrate 11 on which the buffer layer 12 is formed and the second target is preferably 70 mm or less, more preferably 55 mm or less.

The pressure in the vacuum chamber is preferably 1 atm or less, more preferably $133 \times 10^{-2}$ Pa ($1 \times 10^{-2}$ Torr) or less.

Gases or radicals of the elements constituting the semiconductor material having the wurtzite structure may be supplied in the vacuum chamber, if necessary. The pressure in the vacuum chamber for this purpose is preferably 1 atm or less, and the partial pressure of the elements in the vacuum chamber is preferably $133 \times 10^{-3}$ Pa ($1 \times 10^{-3}$ Torr) or more while supplying the gases of the elements, and $133 \times 10^{-5}$ Pa ($1 \times 10^{-5}$ Torr) or less while supplying radicals (atomic radicals) of the elements.

The mean thickness of the semiconductor layer 13 can be adjusted in the range described above by appropriately adjusting the irradiation time of the laser beam (irradiation time of the plasma onto the buffer layer 12). The irradiation time of the laser beam is preferably 3 to 90 minutes, more preferably 15 to 45 minutes, although it depends on the conditions described above.

It is also possible to form a $SiO_2$ layer (heat oxidation layer) on a part of the Si substrate 11, if necessary, by appropriately setting the conditions described above.

The semiconductor material layer 13 is obtained by the method as described above (see FIG. 2(c)).

The device substrate 100 is produced through the steps (1) to (3).

EXAMPLES

The embodiments of the present invention will be described hereinafter with reference to specific examples.

Example 1

The device substrate shown in FIG. 1 was produced as follows.

0A—: A Si(111) substrate was prepared. The spontaneous oxidation layer was not removed from the Si(111) substrate, and the thickness of the substrate used was 600 μm. The spontaneous oxidation layer was formed on the surface of the substrate at a thickness of 2 nm.

1A—: Then, the Si(111) substrate was degreased by cleaning.

The Si(111) substrate was immersed in a mixed solvent (removing liquid) of ethyl alcohol and acetone, and the substrate was degreased by applying ultrasonic vibration to the mixed solvent. The blending ratio of ethyl alcohol and acetone was 1:1 in volume ratio.

2A—: Subsequently, a $La_2O_3$ layer (an oxide layer of a rare earth metal: buffer layer) was formed on the Si(111) substrate.

The Si(111) substrate was attached to a substrate holder, and placed in a vacuum chamber with a back pressure of $133 \times 10^{-8}$ Pa ($1 \times 10^{-8}$ Torr) together with the substrate holder.

The Si(111) substrate was heated to 700° C. at a heating speed of 10° C./minutes using an IR lamp.

A part of the spontaneous oxidation layer was evaporated as SiO when a temperature of the Si(111) substrate reached and exceeded 500° C., and the pressure in the vacuum chamber was increased to $133 \times 10^{-6}$ Pa ($1 \times 10^{-6}$ Torr) However, the pressure in the vacuum chamber settled to a constant pressure of $665 \times 10^{-7}$ Pa ($5 \times 10^{-7}$ Torr) when the temperature of the Si(111) substrate reached 700° C.

The surface (upper face) of the Si(111) substrate was observed in situ by reflection high energy electron diffraction (RHEED), finding no reflection peaks in the RHEED pattern. This means that a 7×7 reconstruction surface of Si(111) was not formed, and the Si(111) substrate was covered with the spontaneous oxidation layer.

After stabilizing the pressure in the vacuum chamber to a constant pressure ($665 \times 10^{-7}$ Pa ($5 \times 10^{-7}$ Torr)), a pulse beam (pulse duration: 10 ns) of the KrF eximer laser (wavelength: 246 nm) was irradiated onto the surface of the $La_2O_3$ target (1A target) disposed in an opposed relation to the Si(111) substrate (sample) to generate a plasma plume of La and O on the surface of the $La_2O_3$ target. The plasma plume of La and O was irradiated onto the Si(111) substrate to form a $La_2O_3$ layer with a mean thickness of 5 nm. The $La_2O_3$ layer was formed under the following conditions:

| KrF eximer laser | |
|---|---|
| energy density | 2.4 $J/cm^2$ |
| frequency | 1 Hz |
| laser irradiation time | 90 seconds |
| sample temperature | 700° C. |
| distance between the sample and target | 30 mm |
| pressure in the vacuum chamber | $665 \times 10^{-7}$ Pa ($5 \times 10^{-7}$ Torr) |

The surface (upper face) of the $La_2O_3$ layer obtained was observed in situ by reflection high energy electron diffraction (RHEED). Diffraction peaks clearly appeared, and orientation of the $La_2O_3$ layer was $La_2O_3$ (001)/Si(111) and $La_2O_3$<100>//Si<1–10>, showing that the $La_2O_3$ layer was epitaxially grown with orientation in the hexagonal (001) face.

3A—: Subsequently, a GaN layer (a group III–V semiconductor layer having the wurtzite structure) was formed on the $La_2O_3$ layer.

A GaN target (2A target) was positioned in place of the $La_2O_3$ target in an opposed relation to the Si(111) substrate (sample) on which the $La_2O_3$ layer was formed.

Then, a pulse beam (pulse duration: 10 ns) of the KrF eximer laser (wavelength: 246 nm) was irradiated onto the surface of the GaN target to generate the plasma plume of Ga and N on the surface of the GaN target. The plasma plume of Ga and N was irradiated onto the $La_2O_3$ layer to form a GaN layer with a mean thickness of 100 nm.

The GaN layer was formed under the following conditions:

| KrF eximer laser | |
|---|---|
| energy density | 2.4 J/cm$^2$ |
| frequency | 10 Hz |
| laser irradiation time | 30 minutes |
| sample temperature | 700° C. |
| distance between the sample and target | 40 mm |
| pressure in the vacuum chamber | 133 × 10$^{-2}$ Pa (5 × 10$^{-2}$ Torr) |

The surface (upper plane) of the La$_2$O$_3$ layer obtained was observed in situ by reflection high energy electron diffraction (RHEED). Diffraction peaks clearly appeared, and orientation of the GaN layer was GaN(001)/La$_2$O$_3$(001)/Si(111) and GaN<100>//La$_2$O$_3$<100>//Si<1–10>, showing that the La$_2$O$_3$ layer was epitaxially grown with orientation in the hexagonal (001) plane.

Examples 2 to 7

The device substrate was produced by the same method as in Examples 1, except that the materials constituting the buffer layer and semiconductor material layer were changed as shown in Table 1.

Example 8

The device substrate shown in FIG. 1 was produced as follows.

0B—: A Si(111) substrate was prepared. The spontaneous oxidation layer was not removed from the Si(111) substrate, and the thickness of the substrate used was 100 μm. The spontaneous oxidation layer was formed on the surface of the substrate at a thickness of 2 nm.

1B—: Then, the Si(111) substrate was degreased by cleaning by the same method as in Example 1.

2B—: Subsequently, a SrO layer (oxide layer of an alkali earth metal: buffer layer) was formed on the Si(111) substrate.

The Si(111) substrate was attached to a substrate holder, and placed in a vacuum chamber with a back pressure of 133×10$^{-8}$ Pa (1×10$^{-8}$ Torr) together with the substrate holder.

Then, the Si(111) substrate was heated to 700° C. at a heating speed of 10° C./minutes using an IR lamp.

A part of the spontaneous oxidation layer was evaporated as SiO when a temperature of the Si(111) substrate reached and exceeded 500° C., and the pressure in the vacuum chamber was increased to 133×10$^{-6}$ Pa (1×10$^{-6}$ Torr). However, the pressure in the vacuum chamber settled to a constant pressure of 665×10$^{-7}$ Pa (5×10$^{-7}$ Torr) when the temperature of the Si(111) substrate reached 700° C.

The surface (upper face) of the Si(111) substrate was observed in situ by reflection high energy electron diffraction (RHEED). No diffraction peaks were observed, and it was shown that no 7×7 reconstruction surface of Si(111) was formed and the Si(111) substrate was covered with the spontaneous oxidation layer.

Then, after stabilizing the pressure in the vacuum chamber to a constant pressure (665×10$^{-7}$ Pa (5×10$^{-7}$ Torr)), a pulse beam (pulse duration: 10 ns) of the KrF eximer laser (wavelength: 246 nm) was irradiated onto the surface of the SrO target disposed in an opposed relation to the Si(111) substrate to generate the plasma plume of Sr and O on the surface of the SrO target. The plasma plume of Sr and O was irradiated onto the Si(111) substrate to form a SrO layer with a mean thickness of 5 nm. The GaN layer was formed under the following conditions:

| KrF eximer laser | |
|---|---|
| energy density | 2.4 J/cm$^2$ |
| frequency | 1 Hz |
| laser irradiation time | 90 seconds |
| sample temperature | 700° C. |
| distance between the sample and target | 30 mm |
| pressure in the vacuum chamber | 665 × 10$^{-7}$ Pa (5 × 10$^{-7}$ Torr) |

The surface (upper face) of the SrO layer obtained was observed in situ by reflection high energy electron diffraction (RHEED). Diffraction peaks clearly appeared, and orientation of the SrO layer was SrO(111)/Si(111) and SrO<1–10>//Si<1–10>, showing that the SrO layer was epitaxially grown with orientation in the cubic (111) face.

3B—: Then, a ZnO layer (the group II–VI semiconductor material layer) was formed on the SrO layer.

A ZnO target (2B target) was positioned in place of the SrO target in an opposed relation to the Si(111) substrate (sample) on which the SrO layer was formed.

Then, a pulse beam (pulse duration: 10 ns) of the KrF eximer laser (wavelength: 246 nm) was irradiated onto the surface of the ZnO target to generate the plasma plume of Zn and O on the surface of the ZnO target. The plasma plume of Zn and O was irradiated onto the SrO layer to form a ZnO layer with a mean thickness of 100 nm. The ZnO layer was formed under the following conditions:

| KrF eximer laser | |
|---|---|
| energy density | 2.4 J/cm$^2$ |
| frequency | 10 Hz |
| laser irradiation time | 30 minutes |
| sample temperature | 700° C. |
| distance between the sample and target | 40 mm |
| pressure in the vacuum chamber | 133 × 10$^{-2}$ Pa (1 × 10$^{-2}$ Torr) while feeding oxygen gas |

The surface (upper plane) of the ZnO layer obtained was observed in situ by reflection high energy electron diffraction (RHEED). Diffraction peaks clearly appeared, and orientation of the ZnO layer was ZnO(001)/SrO(111)/Si(111) and ZnO<100>//SrO<1–10>//Si<1–10>, showing that the ZnO layer was epitaxially grown with orientation in the hexagonal (001) plane.

Examples 7 to 19

The device substrate was produced by the same method as in Example 6, except that the materials constituting the buffer layer and semiconductor material layer were replaced as shown in Table 1.

Example 20

The device substrate was produced by the same method as in Examples 1 and 6, except that the materials constituting the buffer layer and semiconductor material layer were replaced as shown in Table 1.

Comparative Example 1

The device substrate was produced by the same method as in Example 1, except that the buffer layer was omitted.

Comparative Example 2

The device substrate was produced by the same method as in Example 6, except that the buffer layer was omitted.

Comparative Example 3

The device substrate was produced by the same method as in Example 6, except that the buffer layer was omitted, and the materials constituting the semiconductor material layer were replaced as shown in Table 1.

Evaluation

The device substrates produced in the examples and comparative examples were analyzed by X-ray diffraction. The half-width (°) of the maximum peak of the peaks obtained was measured in the examples and comparative examples.

The results are shown in Table 1.

The smaller half-width shows higher crystallinity of the semiconductor material layer.

Epitaxial growth of the semiconductor layer was impossible in Comparative Examples 1 and 2, and the substrate cannot be evaluated.

Table 1 shows that every semiconductor material layer in the examples had a small half-width, and was had better crystallinity than the semiconductor material layer in Comparative Example 3.

Accordingly, the device substrate produced in each example is useful for constructing various devices, and the characteristics and reliability of the device obtained are excellent.

The device substrates were produced by the same method as in Examples 1 using $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$ in place of $La_2O_3$, and using $(Ga_{0.7}B_{0.3})N$ and $Ga(N_{0.7}Sb_{0.3})$, and were evaluated by the same method. The same results as in each example were also obtained.

According to the present invention, a high quality semiconductor material layer is obtained.

Therefore, the characteristics and reliability of the device obtained becomes excellent by constructing the device using the present invention.

Desired characteristics of the device may be readily designed by properly selecting the kinds and compositions of the materials constituting the semiconductor material layer.

The entire disclosure of Japanese Patent Application No. 2002-089820 filed Mar. 27, 2002 is incorporated by reference.

TABLE 1

| | BUFFER LAYER | | SEMICONDUCTOR MATERIAL LAYER | | HALF-WIDTH |
|---|---|---|---|---|---|
| | KIND | MOLAR RATIO | KIND | MOLAR RATIO | [°] |
| EXAMPLE 1 | $La_2O_3$ | 100 | GaN | 100 | 1.8 |
| EXAMPLE 2 | $Ce_2O_3$ | 100 | $(Ga_{0.7}Al_{0.3})N$ | 100 | 1.6 |
| EXAMPLE 3 | $Pr_2O_3$ | 100 | $Ga(N_{0.7}P_{0.3})$ | 100 | 1.5 |
| EXAMPLE 4 | $Nd_2O_3$ | 100 | $(Ga_{0.7}In_{0.3})(N_{0.7}As_{0.3})$ | 100 | 1.7 |
| EXAMPLE 5[*1] | $Pm_2O_3$ | 100 | GaN:InN | 50:50 | 1.9 |
| EXAMPLE 6 | $(La_{0.7}Ce_{0.3})O_3$ | 100 | GaN | 100 | 1.7 |
| EXAMPLE 7[*2] | $La_2O_3:Nd_2O_3$ | 50:50 | GaN | 100 | 1.8 |
| EXAMPLE 8 | SrO | 100 | ZnO | 100 | 1.8 |
| EXAMPLE 9 | SrO | 100 | ZnS | 100 | 1.9 |
| EXAMPLE 10 | BaO | 100 | ZnSe | 100 | 1.9 |
| EXAMPLE 11 | BaO | 100 | CdS | 100 | 1.8 |
| EXAMPLE 12 | BaO | 100 | CdSe | 100 | 1.7 |
| EXAMPLE 13 | CaO | 100 | ZnO | 100 | 1.7 |
| EXAMPLE 14 | MgO | 100 | ZnO | 100 | 1.5 |
| EXAMPLE 15 | SrO | 100 | $Zn(O_{0.5}S_{0.5})$ | 100 | 2.0 |
| EXAMPLE 16 | SrO | 100 | $Cd(S_{0.5}Se_{0.5})$ | 100 | 1.8 |
| EXAMPLE 17[*3] | SrO | 100 | ZnS:CdS | 50:50 | 1.8 |
| EXAMPLE 18 | $(Sr_{0.5}Ba_{0.5})O$ | 100 | CdS | 100 | 1.8 |
| EXAMPLE 19[*4] | SrO:CaO | 50:50 | ZnO | 100 | 2.0 |
| EXAMPLE 20[*5] | $Nd_2O_3$:SrO | 50:50 | ZnO:GaN | 50:50 | 2.0 |
| COMPARATIVE EXAMPLE 1 | — | | GaN | 100 | [*6]NOT MEASURABLE |
| COMPARATIVE EXAMPLE 2 | — | | ZnO | 100 | [*7]NOT MEASURABLE |
| COMPARATIVE EXAMPLE 3 | — | | ZnS | 100 | 5.0 |

[*1] continuous change of InN → GaN in the direction of thickness
[*2] continuous change of $La_2O_3$ → $Nd_2O_3$ in the direction of thickness
[*3] continuous change of ZnS → CdS in the direction of thickness
[*4] continuous change of SrO → CaO in the direction of thickness
[*5] continuous changes of $Nd_2O_3$ → SrO and ZnO → GaN, respectively, in the direction of thickness
[*6] and [*7] measurements were impossible since the semiconductor material layers cannot be epitaxially grown

What is claimed is:

1. A device substrate comprising:
   a substrate;
   an epitaxial buffer layer on the substrate, and containing at least one of a rare earth metal oxide and an alkali earth metal oxide; and
   an epitaxial semiconductor material layer on the buffer layer, and containing at least one of a group II–VI semiconductor material having a wurtzite structure and a group III–V semiconductor material having a wurtzite structure;
   wherein the alkali earth metal further comprises at least one of Mg, Ca, Sr, and Ba.

2. The device substrate according to claim 1, wherein the rare earth metal further comprises at least one of La, Ce, Pr, Nd, Pm, Sm, Eu, Gd, Tb, Dy, Ho, Er, Tm, Yb, Lu and Y.

3. The device substrate according to claim 1, wherein the buffer layer further comprises a hexagonal crystal structure oriented in the (001) plane or a cubic crystal structure oriented in the (111) plane.

4. The device substrate according to claim 1, wherein the buffer layer has a mean thickness of 10 nm or less.

5. The device substrate according to claim 1, wherein the group II–VI semiconductor material having the wurtzite structure further comprises at least one of a Zn compound, Cd compound, and a solid solution containing at least one of the Zn and Cd compounds.

6. The device substrate according to claim 5, wherein the Zn compound further comprises ZnO, ZnS or ZnSe.

7. The device substrate according to claim 5, wherein the Cd compound further comprises CdS or CdSe.

8. The device substrate according to claim 1, wherein the group III–V semiconductor material having the wurtzite structure further comprises GaN, a GaN compound in which a part of Ga in GaN is substituted with at least one of the group III elements, a GaN compound in which a part of N in GaN is substituted with at least one of the group V elements, or at least, one solid solution containing these GaN elements.

9. The device substrate according to claim 1, wherein the semiconductor material layer has a hexagonal crystal structure oriented in the (001) plane.

10. A method for producing a device substrate comprising the steps of:
    cleaning a substrate;
    forming a buffer layer containing at least one of a rare earth metal oxide and an alkali earth metal oxide on the substrate by epitaxially growth by irradiating a plasma containing an oxygen plasma and at least one of a rare earth metal plasma and alkali earth metal plasma on the substrate under a reduced pressure; and
    forming a semiconductor material layer containing at least one of a group II–VI semiconductor material having a wurtzite structure and a group III–V semiconductor material having a wurtzite structure on the buffer layer by epitaxial growth by irradiating at least one of a plasma containing a group II element plasma and a group VI element plasma, and a plasma containing a group III element plasma and a group V element plasma on the buffer layer under a reduced pressure.

11. The method for producing the device substrate according to claim 10, wherein the substrate includes a spontaneous oxidation layer.

12. The method for producing the device substrate according to claim 10, wherein the step for cleaning the substrate omits a treatment for obtaining a reconstitution surface or a hydrogen-terminated surface.

13. The method for producing the device substrate according to claim 11, wherein the buffer layer is epitaxially grown while eliminating the at least one of the spontaneous oxidation layer by selectively irradiating the rare earth metal plasma and the alkali earth metal plasma in the step for forming the buffer layer.

14. The method for producing the device substrate according to claim 10, wherein the rare earth metal further comprises at least one of La, Ce, Pr, Nd, Pm, Sm, Eu, Gd, Tb, Dy, Ho, Er, Tm, Yb, Lu and Y.

15. The method for producing the device substrate according to claim 10, wherein the buffer layer is epitaxially grown as a hexagonal crystal oriented in a (001) plane or as a cubic crystal oriented in a (111) plane.

16. The method for producing the device substrate according to claim 10, wherein the buffer layer has a thickness of 10 nm or less.

17. The method for producing the device substrate according to claim 10, wherein the group II–VI semiconductor material having the wurtzite structure is at least one of a Zn compound, Cd compound, and a solid solution containing at least one of the Zn and Cd compounds.

18. The method for producing the device substrate according to claim 17, wherein the Zn compound further comprises ZnO, ZnS or ZnSe.

19. The method for producing the device substrate according to claim 17, wherein the Cd compound further comprises CdS or CdSe.

20. The method for producing the device substrate according to claim 10, wherein the group III–V semiconductor material having the wurtzite structure is GaN, a GaN compound in which a part of Ga in GaN is substituted with at least one of the group III elements, a GaN compound in which a part of N in GaN is substituted with at least one of the group V elements, or at least one solid solution containing these GaN elements.

21. The method for producing the device substrate according to claim 10, wherein the semiconductor material layer is epitaxially grown as a hexagonal crystal oriented in a (001) plane.

22. The method for producing the device substrate according to claim 10, wherein the plasma is generated using a laser beam.

23. A device substrate comprising:
    a substrate;
    an epitaxial buffer layer on the substrate, and containing at least one of a rare earth metal oxide and an alkali earth metal oxide; and
    an epitaxial semiconductor material layer on the buffer layer, and containing at least one of a group II–VI semiconductor material having a wurtzite structure and a group III–V semiconductor material having a wurtzite structure;
    wherein the group II–VI semiconductor material having the wurtzite structure further comprises at least one of a Zn compound, Cd compound, and a solid solution containing at least one of the Zn and Cd compounds.

24. The device substrate according to claim 23, wherein the substrate is a Si(111) substrate.

25. The device substrate according to claim 23, wherein the Zn compound further comprises ZnO, ZnS or ZnSe.

26. The device substrate according to claim 23, wherein the Cd compound further comprises CdS or CdSe.

27. The device substrate according to claim 1, wherein the substrate is a Si(111) substrate.

28. The method according to claim 10, wherein the substrate is a Si(111) substrate.

29. A device comprising:

a substrate;

an epitaxial buffer layer on the substrate, and containing at least one of a rare earth metal oxide and an alkali earth metal oxide; and an epitaxial semiconductor material layer on the buffer layer, and containing at least one of a group II–VI semiconductor material having a wurtzite structure and a group III–V semiconductor material having a wurtzite structure;

wherein the alkali earth metal further comprises at least one of Mg, Ca, Sr, and Ba.

* * * * *